United States Patent
Camacho et al.

(10) Patent No.: US 9,331,003 B1
(45) Date of Patent: May 3, 2016

(54) INTEGRATED CIRCUIT PACKAGING SYSTEM WITH PRE-MOLDED LEADFRAME AND METHOD OF MANUFACTURE THEREOF

(71) Applicants: Zigmund Ramirez Camacho, Singapore (SG); Bartholomew Liao Chung Foh, Singapore (SG); Sheila Marie L. Alvarez, Singapore (SG); Dao Nguyen Phu Cuong, Singapore (SG); HeeJo Chi, Yeoju-gun (KR)

(72) Inventors: Zigmund Ramirez Camacho, Singapore (SG); Bartholomew Liao Chung Foh, Singapore (SG); Sheila Marie L. Alvarez, Singapore (SG); Dao Nguyen Phu Cuong, Singapore (SG); HeeJo Chi, Yeoju-gun (KR)

(73) Assignee: STATS ChipPac Ltd., Singapore (SG)

( * ) Notice: Subject to any disclaimer, the term of this patent is extended or adjusted under 35 U.S.C. 154(b) by 0 days.

(21) Appl. No.: 14/229,538

(22) Filed: Mar. 28, 2014

(51) Int. Cl.
  *H01L 21/02* (2006.01)
  *H01L 23/495* (2006.01)
  *H01L 23/31* (2006.01)
  *H01L 21/48* (2006.01)

(52) U.S. Cl.
  CPC ...... *H01L 23/49541* (2013.01); *H01L 23/3107* (2013.01); *H01L 21/4832* (2013.01); *H01L 21/4846* (2013.01); *H01L 23/3114* (2013.01); *H01L 23/49575* (2013.01)

(58) Field of Classification Search
  CPC ............ H01L 21/4832; H01L 21/4846; H01L 23/3114; H01L 23/49575
  See application file for complete search history.

(56) References Cited

U.S. PATENT DOCUMENTS

| | | |
|---|---|---|
| 5,656,550 A | 8/1997 | Tsuji et al. |
| 6,238,952 B1 | 5/2001 | Lin |
| 6,562,660 B1 | 5/2003 | Sakamoto et al. |
| 7,049,177 B1 | 5/2006 | Fan et al. |
| 7,129,116 B2 | 10/2006 | Islam et al. |
| 7,291,908 B2 | 11/2007 | Pan et al. |
| 7,312,105 B2 | 12/2007 | Huang et al. |
| 8,193,037 B1 | 6/2012 | Bathan et al. |
| 8,502,387 B2 | 8/2013 | Choi et al. |
| 8,557,638 B2 | 10/2013 | Do et al. |
| 8,623,711 B2 | 1/2014 | Do et al. |
| 8,629,567 B2 | 1/2014 | Do et al. |
| 2003/0006055 A1 | 1/2003 | Chien-Hung et al. |
| 2005/0248041 A1 | 11/2005 | Kuah et al. |
| 2010/0164079 A1* | 7/2010 | Dekker ............... H01L 21/4846 257/676 |
| 2012/0018865 A1* | 1/2012 | Camacho ............ H01L 21/4832 257/676 |
| 2012/0139104 A1 | 6/2012 | Camacho et al. |
| 2013/0154105 A1 | 6/2013 | Do et al. |
| 2013/0154119 A1 | 6/2013 | Do et al. |

\* cited by examiner

*Primary Examiner* — Nicholas Tobergte
(74) *Attorney, Agent, or Firm* — Ishimaru & Associates LLP

(57) ABSTRACT

An integrated circuit packaging system, and method of manufacture thereof, includes: lead islands; a pre-molded material surrounding a bottom of the lead islands; a device over a portion of the lead islands and having electrical connections to another portion of the lead islands, the electrical connections over areas of the another portion of the lead islands over areas covered by the pre-molded material; and an encapsulation over the device and the lead islands.

19 Claims, 10 Drawing Sheets

INTEGRATED CIRCUIT PACKAGING SYSTEM WITH PRE-MOLDED LEADFRAME AND METHOD OF MANUFACTURE THEREOF

TECHNICAL FIELD

The present invention relates generally to an integrated circuit packaging system, and more particularly to a system with a pre-molded leadframe.

BACKGROUND ART

Semiconductor chips have become progressively more complex, driven in large part by the need for increasing processing power in a smaller chip size for compact or portable electronic devices such as cell phones, smart phones, personal media systems, or ultraportable computers.

The semiconductor chips are packaged in packaging systems. Most kinds of integrated circuit packaging systems are made by placing the semiconductor chips on a lead frame; wire bonding the chips to the metal leads of that lead frame; and then protecting the chips with encapsulation.

Leadframe technology is widely used in many package varieties that use metal leads extending outside the package housing. Conventional integrated circuit packaging manufacture uses costly materials for leadframe, such as core and pre-preg, and build-up processes, which have long cycle times and involves more process controls.

Thus, a need still remains for a precise and cost-effective way of creating leadframes. In view of the shrinking sizes of electronic components, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a conductive material; processing the conductive material to form I/O (input/output) pillars having exposed pads and a bottom recess; forming a pre-molded material in the bottom recess; forming lead islands by further processing the conductive material above the pre-molded material; connecting a device over a portion of the lead islands and having electrical connections to another portion of the lead islands, the electrical connections over areas of the another portion of the lead islands over areas covered by the pre-molded material; and encapsulating the device on the lead islands.

The present invention provides an integrated circuit packaging system, including: lead islands; a pre-molded material surrounding a bottom of the lead islands; a device over a portion of the lead islands and having electrical connections to another portion of the lead islands, the electrical connections over areas of the another portion of the lead islands over areas covered by the pre-molded material; and an encapsulation over the device and the lead islands.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
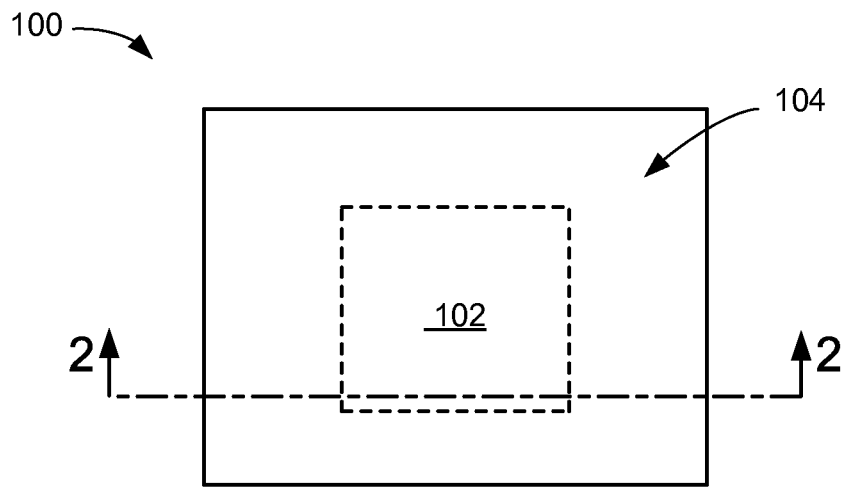
FIG. 1 is a plan view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the active side of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure.

The term "processing" as used herein includes deposition of material or photoresist, patterning, exposure, development, etching, cleaning, and/or removal of the material or photoresist as required in forming a described structure.

Wavy lines are used throughout the figures to show that only a portion of the full structure is being shown. Portions of the structures and components are omitted for simplicity and clarity.

Molded Interconnect Substrate (MIS) structures use Dry Film Resist (DFR) and plate-up processes to form conductive traces. The MIS structures require two layers of DFR patterning to plate-up the conductive traces and vias consecutively. Build-up processes for fabricating MIS structures have long cycle times, high material costs, and complicated process controls.

Embodiments of this invention, on the other hand, utilize low cost, coreless, single metal layer subtractive processes to form pillars and subsequently trace layers. Embodiments of the invention can be used in the production of pre-half-etched metal frames, such as for quad-flat no-leads sawn with standoff (QFNs-st) or Leadframe Grid Array (LFGA) packages, with pre-molded materials, which are patterned using subtractive processes.

Referring now to FIG. 1, therein is shown a plan view of an integrated circuit packaging system 100 in a first embodiment of the present invention. The integrated circuit packaging system 100 includes a device 102, such as an integrated circuit die, encapsulated in an encapsulation 104. The device 102 shown with dotted lines to indicate that it is not normally visible from the outside.

The device 102 is covered by the encapsulation 104, which can be made from a material such as epoxy molding compound, curable underfill, or other moldable compound or type of encapsulant, for example.

Figure 2:
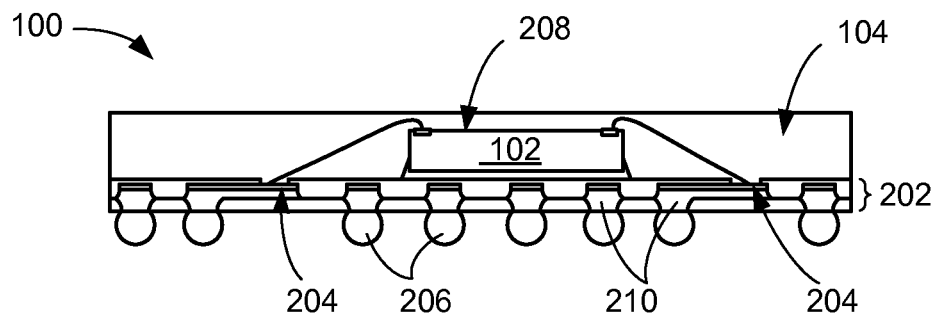
FIG. 2 is a cross-sectional view of FIG. 1 along the section line 2-2 of FIG. 1.

Referring now to FIG. 2, therein is shown a cross-sectional view of FIG. 1 along the section line 2-2 of FIG. 1. This view shows the device 102 being mounted over a conductive substrate, such as a leadframe 202. The device 102 is wire bonded to bond traces 204 which are embedded in the leadframe 202. External contacts 206, such as solder balls, are attached to a bottom surface of the leadframe 202. The encapsulation 104 is formed on the device 102 and a top surface of the leadframe 202.

The encapsulation 104 protects the device 102 and the top surface of the leadframe 202 from wear or damage during manufacturing. The top surface of the encapsulation 104 can be parallel with an active side 208 of the device 102. The active side 208 can be wire bonded to the bond traces 204. The bond traces 204 are conductive plating, which is embedded in the leadframe 202 and electrically connected to the device 102. An inactive side of the device 102, which faces away from the active side 208, is adhered to the top surface of the leadframe 202.

The leadframe 202 is a multi-layer structure having conductive traces embedded in insulation layers. The leadframe 202 provides electrical connections from one surface to an opposite surface thereof, or re-routes electrical connections within a same surface. The leadframe 202 also provide a mounting surface for the device 102.

The external connectors 206 are formed outside the integrated circuit packaging system 100. The external connectors 206 are attached to bottom surfaces of conductive portions 210 of the leadframe 202, providing connections between the device 102 and components outside the integrated circuit packaging system 100.

For illustrative purposes, the device 102 is shown as a wire bondable integrated circuit, although it is understood that the device 102 may be different, such as a flip chip or another electronic component.

Figure 3:
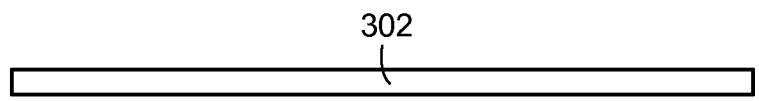
FIG. 3 is a cross-sectional view of a metal sheet in a manufacturing step of the integrated circuit packaging system of FIG. 1.

Referring now to FIG. 3, therein is shown a cross-sectional view of a metal sheet 302 in a manufacturing step of the integrated circuit packaging system 100 of FIG. 1. The metal sheet 302 is a conductive metal, such as copper and alloys thereof. The metal sheet 302 has a top surface parallel to a bottom surface. The embodiments of the inventions use a low cost single metal sheet, such as the metal sheet 302 to replace costly materials used in conventional manufacturing processes.

Figure 4:
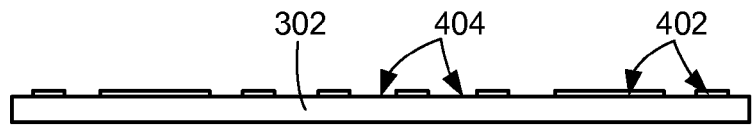
FIG. 4 is the structure of FIG. 3 in a pre-plating phase of manufacture.

Referring now to FIG. 4, therein is shown the structure of FIG. 3 in a pre-plating phase of manufacture. Pre-plated leadframe (PPF) traces 402 are deposited on a metal top surface 404 by DFR mask patterning process and electrolytic PPF plating.

The PPF traces 402 are conductive structures made of conductive metals and alloys thereof, such as nickel-palladium-gold (NiPdAu), nickel-palladium (NiPd), or silver (Ag) plating. The PPF traces 402 provide corrosion resistance and wear protection for the metal sheet 302, and improve package reliability performance. The PPF traces 402 can be etch resist and patterned to preserve the metal top surface 404 thereunder from being etched.

Figure 5:
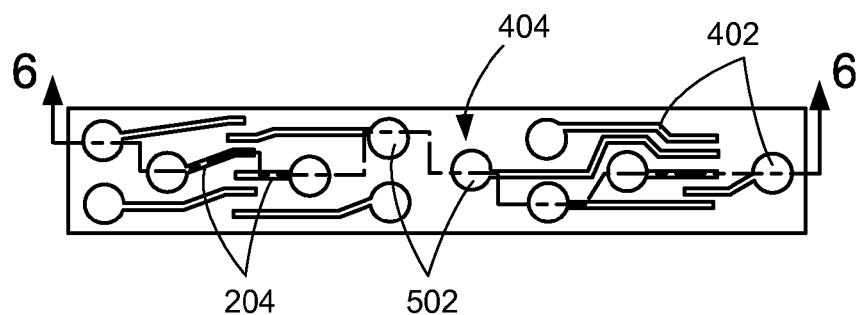
FIG. 5 is a top view of the structure of FIG. 4 in an etching phase of manufacture.

Referring now to FIG. 5, therein is shown a top view of the structure of FIG. 4 in an etching phase of manufacture. This view shows the uncovered metal top surface 404 and the PPF traces 402. The PPF traces 402 include pad traces 502 and the bond traces 204. The bond traces 204 are narrow extensions of the pad traces 502, routing connections of the pad traces 502 to other locations on the metal top surface 404.

Figure 6:
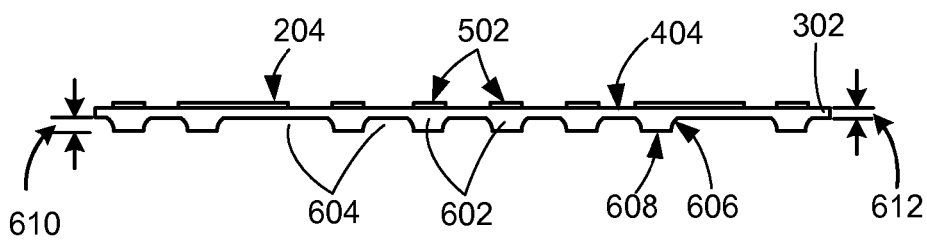
FIG. 6 is a cross-sectional view of the structure of FIG. 5 along the section line 6-6 of FIG. 5.

Referring now to FIG. 6, therein is shown a cross-sectional view of the structure of FIG. 5 along the section line 6-6 of FIG. 5. The metal sheet 302 is half-etched from a metal bottom surface by a DFR mask etch resist process (not shown) and chemical etching, to form Input/Output (I/O) pillars 602 protruding from a bottom recess 604 having concave pillar side walls 606 and exposed pads 608.

Each of the I/O pillars 602 has one of the corresponding pad traces 502 on the metal top surface 404 and one of the exposed pads 608 as a bottom. The I/O pillars 602 can be electrically connected to connect devices on opposite sides of the metal sheet 302. The bond traces 204 are extended from the pad traces 502, on the metal top surface 404 above the bottom recess 604. While the exposed pads 608 can be connected to external devices, such as another integrated circuit packaging system, the pad traces 502 or bond traces 204 can be connected to internal devices of the packaging system, such as the device 102 of FIG. 1.

The metal sheet 302 has an approximate thickness of 150 um. A half-etching depth 610, or the depth of the recess 604, is approximately 125 um. The pad traces 502 and bond traces 204 have an approximate plating thickness of 3 to 5 um. A bottom surface of the recess 604 can be parallel to the metal top surface 404. After etching, the remaining portion of the metal sheet 302 has an even thickness 612 of approximately 25 um. These thicknesses are critical to provide sufficient strength to prevent warpage of the metal sheet 302.

Figure 7:
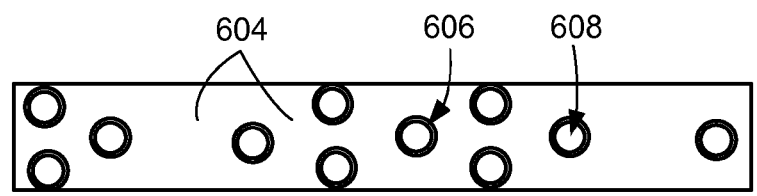
FIG. 7 is a bottom view of the structure of FIG. 6.

Referring now to FIG. 7, therein is shown a bottom view of the structure of FIG. 6. The exposed pads 608 with the concaved pillar side walls 606 are visible from the bottom recess 604. Each of the I/O pillars of FIG. 6 is separated and surrounded by the bottom recess 604.

Figure 8:
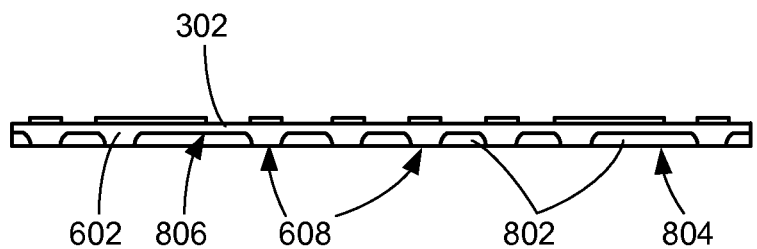
FIG. 8 is the structure of FIG. 6 in a pre-molding phase of manufacture.

Referring now to FIG. 8, therein is shown the structure of FIG. 6 in a pre-molding phase of manufacture. The bottom recess 604 of FIG. 6 will be filled with molding material to form a pre-molded material 802. The exposed pads 608 are exposed from an exposed pre-molded material surface 804. The exposed pre-molded material surface 804 is aligned with the exposed pads 608. A buried pre-molded material surface 806 is parallel to the exposed pre-molded material surface 804 and in contact with the metal sheet 302. The pre-molded material 802 insulates I/O pillars 602, and makes the etched metal sheet 302 more rigid during the manufacturing processes.

Figure 9:
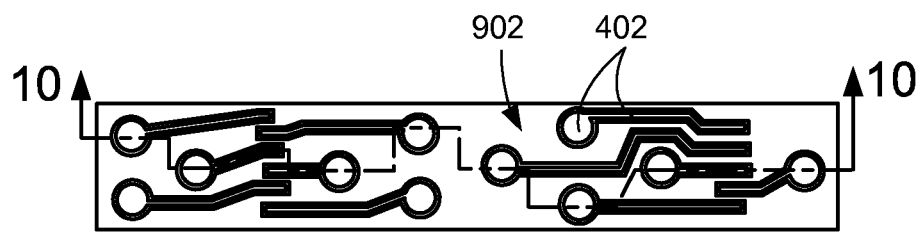
FIG. 9 is a top view of the structure of FIG. 8 in an etching phase of manufacture.

Referring now to FIG. 9, therein is shown a top view of the structure of FIG. 8 in an etching phase of manufacture. The metal sheet 302 of FIG. 8 is half-etched off from the exposed metal top surface 404 of FIG. 4 to form a top recess 902. The PPF traces 402, which resist etching and act as an etch resist, are surrounded by the top recess 902.

Figure 10:
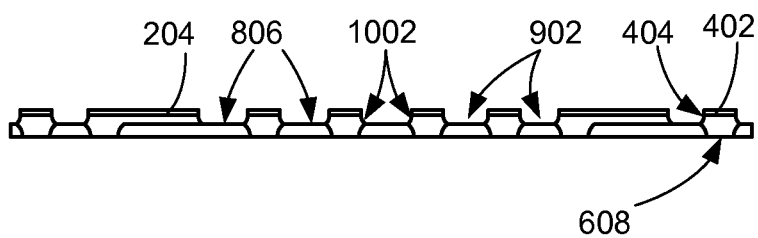
FIG. 10 is a cross-sectional view of FIG. 9 along the section line 10-10 of FIG. 9.

Referring now to FIG. 10, therein is shown a cross-sectional view of FIG. 9 along the section line 10-10 of FIG. 9. The buried pre-molded material surface 806 is partially exposed from the top recess 902. The portion of the buried pre-molded material surface 806 covered by the bond traces 204 is still buried thereunder. The top recess 902 has convex side walls 1002. The remaining metal top surface 404 is covered by the PPF traces 402.

The metal sheet 302 of FIG. 3 has been broken down into individual structures after etching processes. The individual structures are conductive but separated from each other. Each of the individual conductive structures has an exposed top surface, such as one of the PPF traces, and an exposed bottom surface, such as one of the exposed pads 608.

Figure 11:
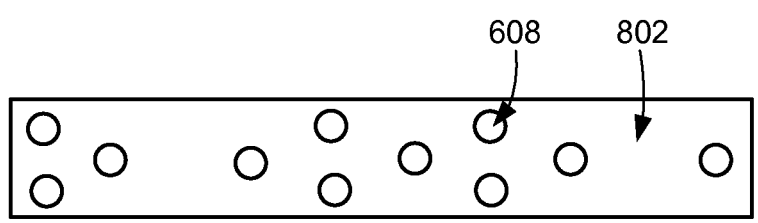
FIG. 11 is a bottom view of the structure of FIG. 10.

Referring now to FIG. 11, therein is shown a bottom view of the structure of FIG. 10. The exposed pads 608 are separated from each other and exposed from the pre-molded material 802. The convex side walls 1002 of FIG. 10 are buried in the pre-molded material 802.

Figure 12:
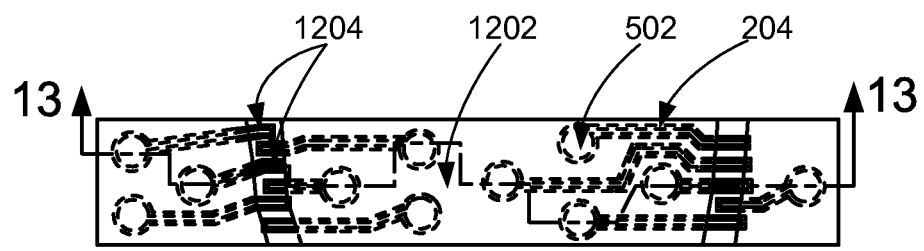
FIG. 12 is a plan view of the structure of FIG. 9 in an optional protection phase of manufacture.

Referring now to FIG. 12, therein is shown a plan view of the structure of FIG. 9 in an optional protection phase of manufacture. A protection layer 1202, such as solder resist, is applied in the top recess 902 of FIG. 9, on the pad traces 502, and partially on the bond traces 204 at desired locations. Each of the bond traces 204 has an exposed portion 1204 exposed from gaps of the protection layer 1202.

Figure 13:
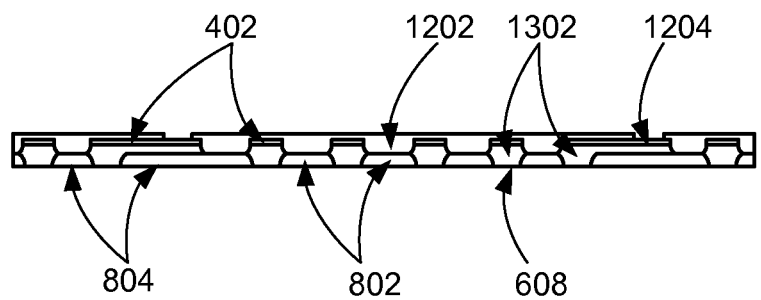
FIG. 13 is a cross-sectional view of FIG. 9 along the section line 13-13 of FIG. 12.

Referring now to FIG. 13, therein is shown a cross-sectional view of FIG. 12 along the section line 13-13 of FIG. 12. Each of individual lead islands 1302 has one of the exposed pads 608 as a bottom and one of the PPF traces 402 on a lead island top surface. The protection layer 1202 is formed in the top recess 902 of FIG. 10, partially on the PPF traces 402, having the exposed portion 1204 exposed from the gaps of the protection layer 1202. The lead islands 1302 are surrounded and insulated by the protection layer 1202 and the pre-molded materials 802, leaving the exposed pads 608 exposed from the exposed pre-molded materials surface 804.

Figure 14:
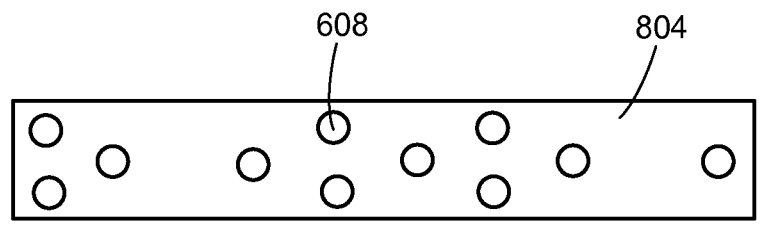
FIG. 14 is a bottom view of the structure of FIG. 13.

Referring now to FIG. 14, therein is shown a bottom view of the structure of FIG. 13. The exposed pads 608 are exposed from the exposed pre-molded materials surface 804.

Figure 15A:
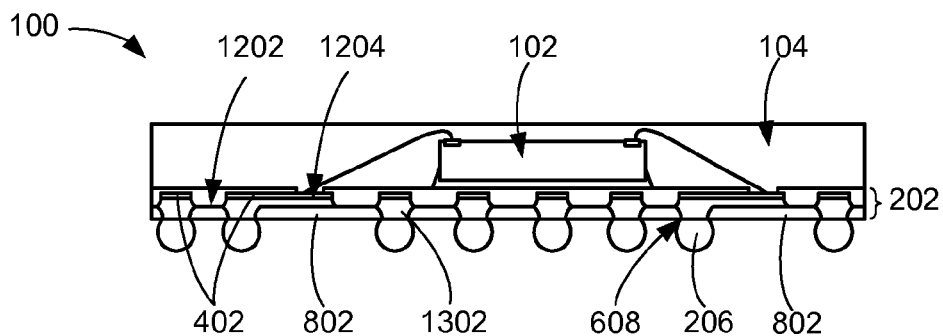
FIG. 15A is the structure of FIG. 13 in a package assembly phase of manufacture.

Referring now to FIG. 15A, therein is shown the structure of FIG. 13 in a package assembly phase of manufacture. The integrated circuit packaging system 100 includes the device 102 adhered to the leadframe 202 by an epoxy layer. The encapsulation 104 is formed on top of the leadframe 202 and the device 102. The device 102 is wire bonded to the exposed bond traces 1204 embedded in the leadframe 202 and exposed from the protection layer 1202. The external contacts 206 are attached to the exposed pads 608. The device 102 is electrically connected to the external contacts 206 via the exposed bond traces 1204, the PPF traces 402, and the lead islands 1302. The lead islands 1302 are covered by the PPF traces 402, surrounded and insulated by the protection layer 1202 and the pre-molded materials 802.

Figure 15B:
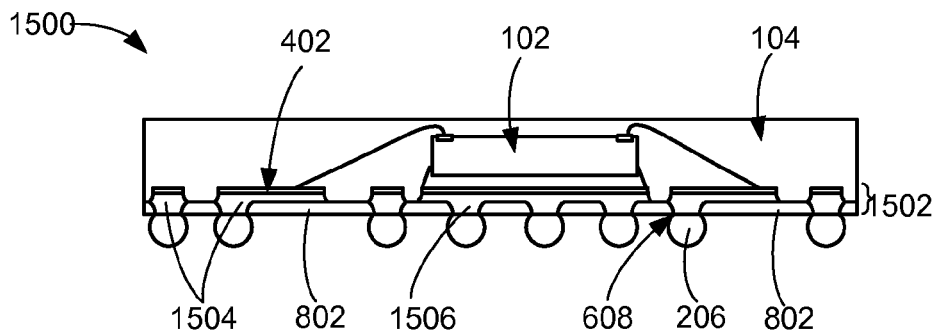
FIG. 15B is the structure of FIG. 15A without the optional protection layer in a package assembly phase of manufacture.

Referring now to FIG. 15B, therein is shown the structure of FIG. 15A without the optional protection layer 1202, in a package assembly phase of manufacture. The integrated circuit packaging system 1500, includes the device 102 adhered to the leadframe 1502. The encapsulation 104 is formed on the leadframe 1502 and the device 102. The device 102 is wire bonded to the PPF traces 402, which is the top layer of the leadframe 1502. The external contacts 206 are attached to the exposed pads 608. The device 102 is electrically connected to the external contacts 206 via the PPF traces 402 and the lead islands 1504. The lead islands 1504 are insulated by the pre-molded materials 802.

In the center of the leadframe 1502 is a die paddle 1506 under the device 102. The die paddle 1506 supports the device 102 and includes the external connectors 206 for heat dissipation.

Figure 16:
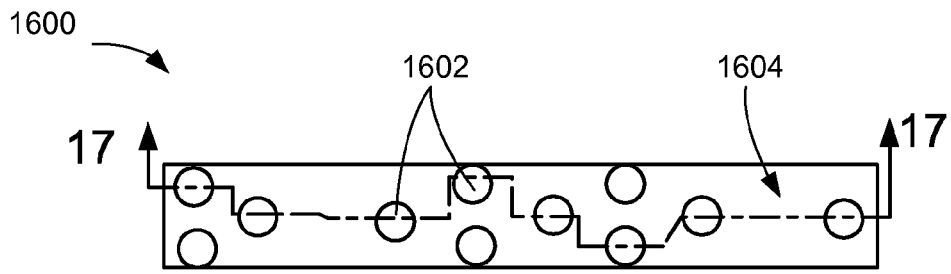
FIG. 16 is a bottom view of the structure of FIG. 3 in a dry film resist (DFR) coating phase of manufacture of an integrated circuit packaging system in a second embodiment of the present invention.

Referring now to FIG. 16, therein is shown a bottom view of the structure of FIG. 3 in a dry film resist (DFR) coating phase of manufacture of an integrated circuit packaging system 1600 in a second embodiment of the present invention. A patterned DFR layer 1602 is deposited on a metal bottom surface 1604. The patterned DFR layer 1602 is an etch resist preserving the portion of the bottom surface 1604 thereunder from being etched.

Figure 17:
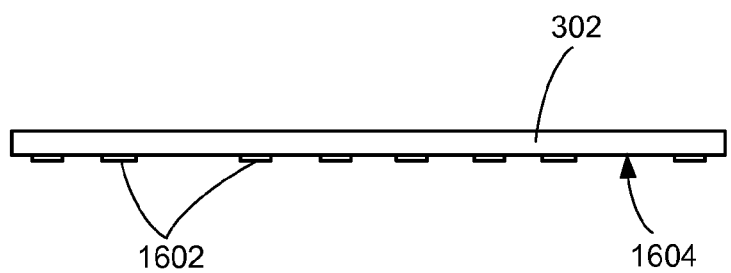
FIG. 17 is a cross-sectional view of the structure of FIG. 16 along the section line 17-17 of FIG. 16.

Referring now to FIG. 17, therein is shown a cross-sectional view of the structure of FIG. 16 along the section line 17-17 of FIG. 16. The etching resist DFR layer 1602 protects a portion of the metal bottom surface 1604 from being etched off.

Figure 18:
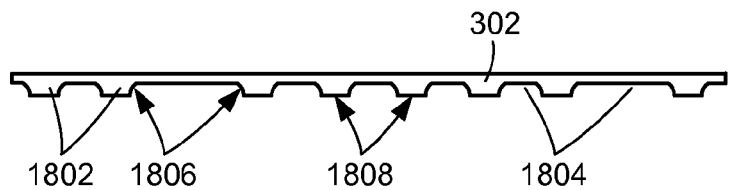
FIG. 18 is the structure of FIG. 17 in an etching and DFR stripping phase of manufacture.

Referring now to FIG. 18, therein is shown the structure of FIG. 17 in an etching and DFR stripping phase of manufacture. The metal sheet 302 is half-etched from the uncovered metal bottom surface 1604 of FIG. 17 by a DFR mask etch resist process (not shown) and chemical etching. The metal sheet 302 is half-etched to form I/O pillars 1802 protruded from and surrounded by a bottom recess 1804. The patterned DFR layer 1602 of FIG. 16 is stripped off from the bottom surface of the metal sheet 302. The I/O pillars 1802 have concaved pillar side walls 1806 and exposed pads 1808.

The metal sheet 302 has an approximate thickness of 150 um. Half-etching depth, or the depth of the bottom recess 1804, is approximately 125 um. After etching, the remaining metal thickness is approximately 25 um. A top surface of the metal sheet 302 is parallel to a bottom surface of the bottom recess 1804.

Figure 19:
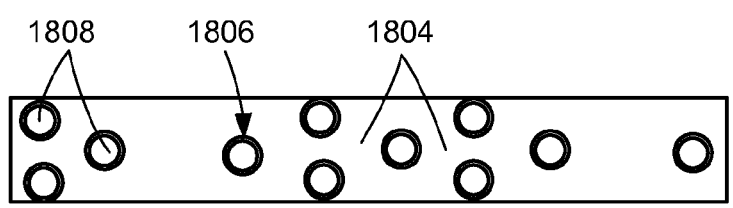
FIG. 19 is a bottom view of the structure of FIG. 18.

Referring now to FIG. 19, therein is shown a bottom view of the structure of FIG. 18. The exposed pads 1808 and the concaved side walls 1806 are shown from the bottom recess 1804. The exposed pads 1808 are separated from each other by the bottom recess 1804.

Figure 20:
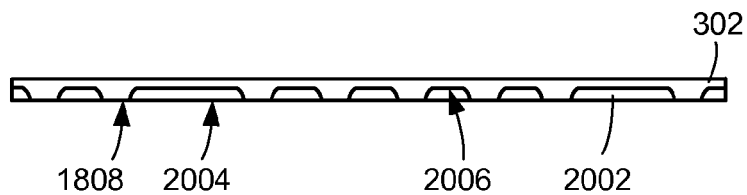
FIG. 20 is the structure of FIG. 18 in a pre-molding phase of manufacture.

Referring now to FIG. 20, therein is shown the structure of FIG. 18 in a pre-molding phase of manufacture. The bottom recess 1804 of FIG. 18 is filled with molding materials to form a pre-molded material 2002. The exposed pads 1808 are exposed from an exposed pre-molded material surface 2004. The exposed pre-molded material surface 2004 is aligned with the exposed pads 1808. A buried pre-molded material surface 2006 is parallel to the exposed pre-molded material surface 2004 and in contact with the metal sheet 302.

Figure 21:
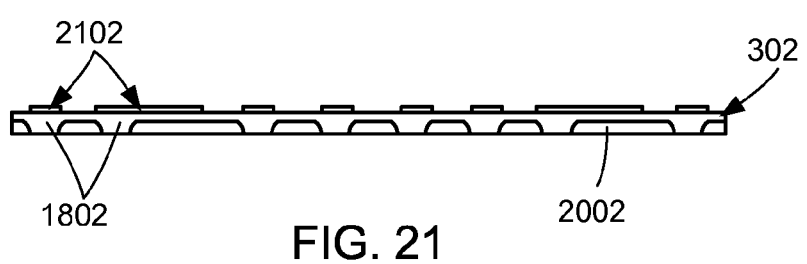
FIG. 21 is the structure of FIG. 20 in a DFR phase of manufacture.

Referring now to FIG. 21, therein is shown the structure of FIG. 20 in a DFR phase of manufacture. A patterned DFR layer 2102 is deposited on a top surface of the metal sheet 302. The DFR layer 2102 is patterned in such a configuration that each of the I/O pillars 1802 has a corresponding piece of the DFR layer 2102 on the top surface of the metal sheet 302. Each piece of the DRF layer 2102 has a narrow extension extended over the pre-molded material 2002.

Figure 22:
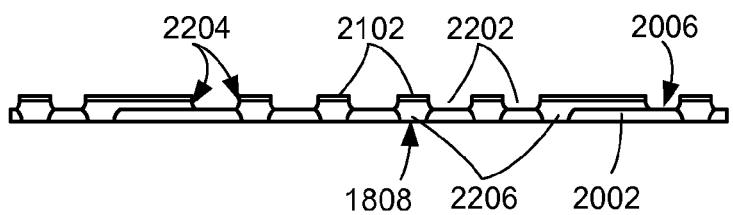
FIG. 22 is the structure of FIG. 21 in an etching phase of manufacture.

Referring now to FIG. 22, therein is shown the structure of FIG. 21 in an etching phase of manufacture. The metal sheet 302 of FIG. 21 is etched from an exposed top surface thereof to form a top recess 2202. The buried pre-molded material surfaces 2006 are exposed partially from the top recess 2202. The top recess 2202 has convex recess side walls 2204. Each of lead islands 2206 has one of the exposed pads 1808 as bottom and one piece of the DFR layer 2102 on a top surface thereof. The bottom half of the lead islands 2206 are insulated and separated by the pre-molded material 2002, while the top half of the lead islands 2206 are separated by the top recess 2202. Extensions of the lead islands 2206 are extended on the pre-molded material 2002.

Figure 23:
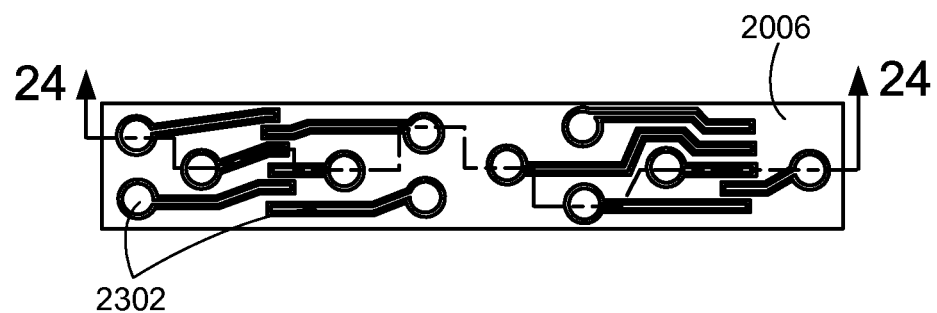
FIG. 23 is a top view of the structure of FIG. 22 in a DFR stripping phase of manufacture.

Referring now to FIG. 23, therein is shown a top view of the structure of FIG. 22 in a DFR stripping phase of manufacture. The DFR layer 2102 of FIG. 22 is stripped off from the top surface of the lead islands 2206 of FIG. 22. The lead island top surfaces 2302 and the buried pre-molded material surface 2006 are visible.

Figure 24:
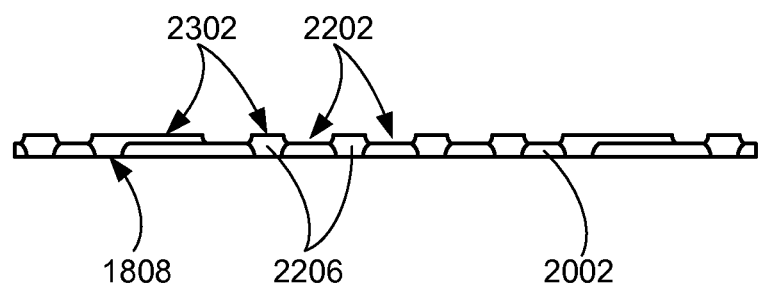
FIG. 24 is a cross-sectional view of the structure of FIG. 23 along the section line 24-24 of FIG. 23.

Referring now to FIG. 24, therein is shown a cross-sectional view of the structure of FIG. 23 along the section line 24-24 of FIG. 23. The bottom half of the lead islands 2206 are insulated and separated by the pre-molded material 2002, while the top half of the lead islands 2206 are separated by the top recess 2202. Each of the lead islands 2206 has one of the exposed pads 1808 as a bottom and a piece of the corresponding lead island top surface 2302 as a top. A portion of the lead islands 2206 can be extended over the pre-molded material 2002.

Figure 25:
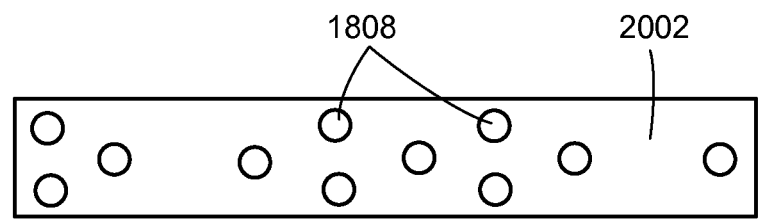
FIG. 25 is a bottom view of the structure of FIG. 24.

Referring now to FIG. 25, therein is shown a bottom view of the structure of FIG. 24. Each of the exposed pads 1808 is separated and surrounded by the pre-molded material 2002.

Figure 26:
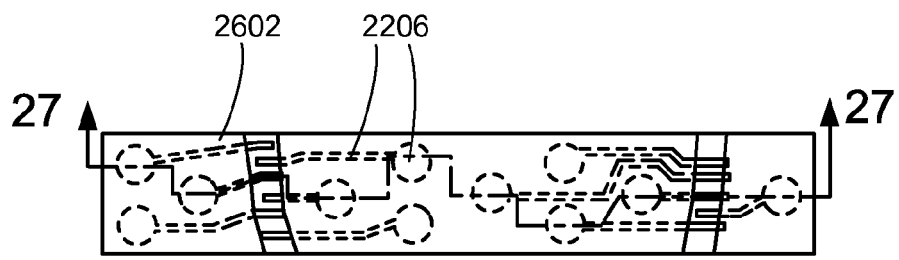
FIG. 26 is a plan view of the structure of FIG. 23 in an optional protection phase of manufacture.

Referring now to FIG. 26, therein is shown a plan view of the structure of FIG. 23 in an optional protection phase of manufacture. A protection layer 2602 is applied in the top recess 2202 of FIG. 22, and partially on the lead islands 2206. A portion of the lead island top surfaces 2302 of FIG. 23 is exposed from gaps of the protection layer 2602, where bonding pads can be deposited on.

Figure 27:
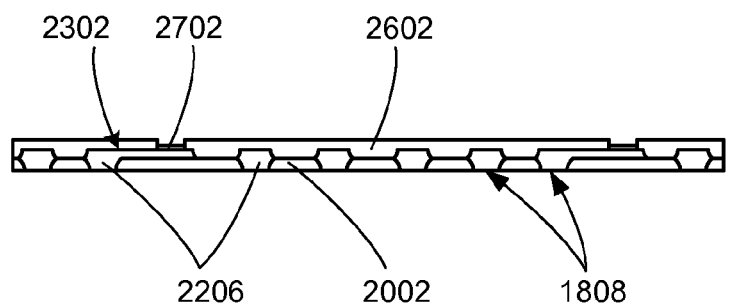
FIG. 27 is a cross-sectional view of the structure of FIG. 26 along the section line 27-27 of FIG. 26.

Referring now to FIG. 27, therein is shown a cross-sectional view of the structure of FIG. 26 along the section line 27-27 of FIG. 26. The bottom half of the lead islands 2206 are insulated and separated by the pre-molded material 2002, while the top half of the lead islands 2206 are insulated and separated by the protection layer 2602. The exposed pads 1808 are exposed from the pre-molded material 2002. Bond traces 2702 are formed on the exposed lead island top surfaces 2302 of FIG. 23. Surfaces of the bond traces 2702 are lower than the surface of the protection layer 2602.

Figure 28:
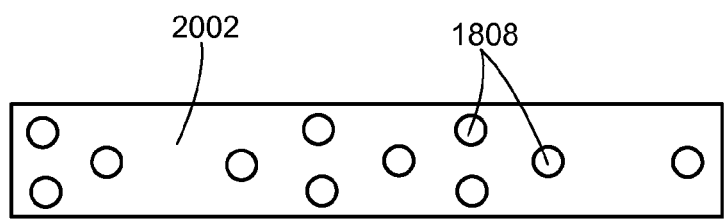
FIG. 28 is a bottom view of the structure of FIG. 27.

Referring now to FIG. 28, therein is shown a bottom view of the structure of FIG. 27. Each of the exposed pads 1808 is separated and surrounded by the pre-molded material 2002.

Figure 29A:
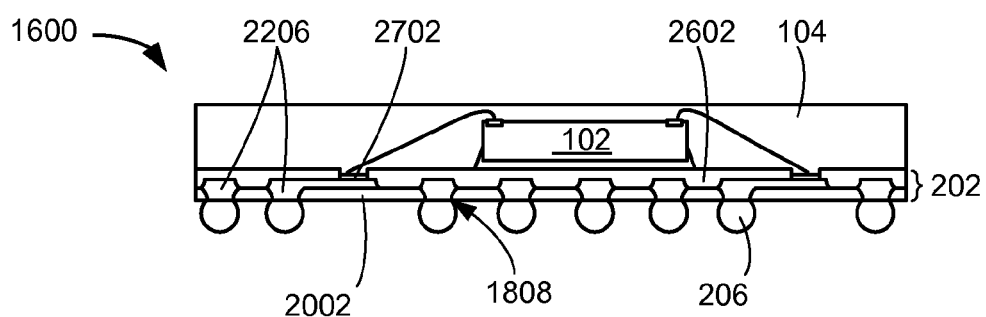
FIG. 29A is the structure of FIG. 27 in a package assembly phase of manufacture.

Referring now to FIG. 29A, therein is shown the structure of FIG. 27 in a package assembly phase of manufacture. The integrated circuit packaging system 1600 includes the device 102 mounted on the leadframe 202. The encapsulation 104 is formed on the leadframe 202 and the device 102. The device 102 is wire bonded to the bond traces 2702 embedded in the leadframe 202. The external contacts 206 are attached to the exposed pads 1808. The device 102 is electrically connected to the external contacts 206 via the bond traces 2702 and the lead islands 2206. The bottom half of the lead islands 2206 are insulated and separated by the pre-molded material 2002, while the top half of the lead islands 2206 are insulated and separated by the protection layer 2602.

Figure 29B:
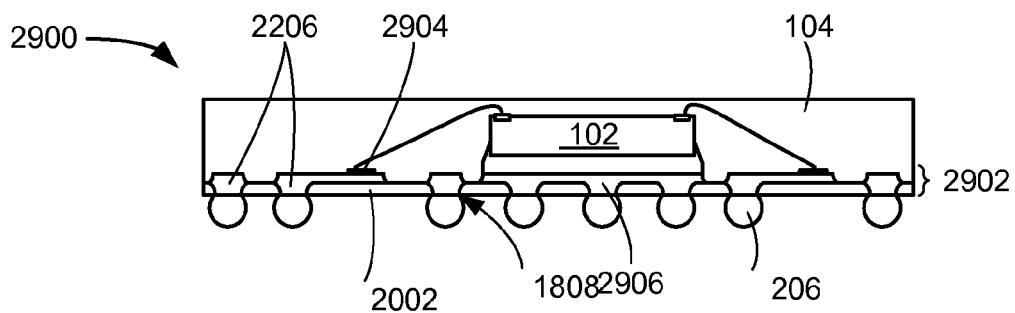
FIG. 29B is the structure of FIG. 29A without the optional protection layer in a package assembly phase of manufacture.

Referring now to FIG. 29B, therein is shown the structure of FIG. 29A without the optional protection layer 2602, in a package assembly phase of manufacture. The integrated circuit packaging system 2900, includes the device 102 adhered to the leadframe 2902 by an epoxy layer. The encapsulation 104 is formed on the leadframe 2902 and the device 102. The device 102 is wire bonded to the bond traces 2904 on the lead islands 2206. The external contacts 206 are attached to the exposed pads 1808. The device 102 is electrically connected to the external contacts 206 via the bond traces 2904 and the lead islands 2206. The bottom half of the lead islands 2206 are insulated and separated by the pre-molded material 2002.

in the center of the leadframe 2902 is a die paddle 2906 under the device 102. The die paddle 2906 supports the device 102 includes the external connectors 206 for heat dissipation.

Figure 30:
FIG. 30 is the structure of FIG. 18 on an optional work jig.

Referring now to FIG. 30, therein is shown the structure of FIG. 18 on an optional work-jig. The half-way etched metal sheet 302 is positioned on a carrier 3002 as a work jig for more efficient handling of the etched metal sheet 302. The work jig can be a FR4 carrier, which is an Underwriters Laboratory standard flame retardant material, a metal carrier, or equivalent structure.

Figure 31:
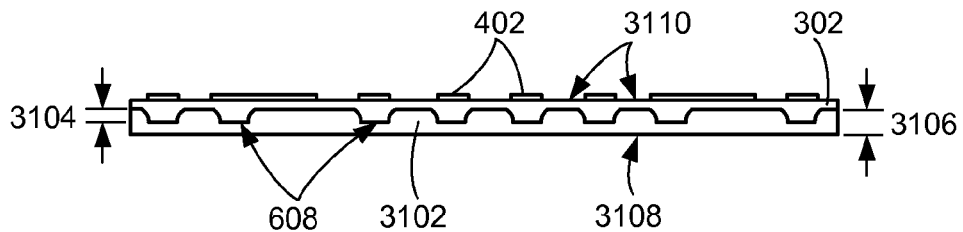
FIG. 31 is the structure of FIG. 6 in an alternative overmolding phase of manufacture.

Referring now to FIG. 31, therein is shown the structure of FIG. 6 in an alternative over-molding phase of manufacture. An over-molded material 3102 is formed in the bottom recess 604 of FIG. 6 and over the exposed pads 608. The exposed pads 608 are buried in the over-molded materials 3102. A recess thickness 3104 is less than an over-molded materials thickness 3106. The over-molded material 3102 has an over-molded material surface 3108. The metal sheet 302 has an exposed metal top surface 3110, which is uncovered by the PPF traces 402.

The thicker over-molded materials 3102 is for more rigid process handling and also for better moldability. The over-molded materials thickness 3106 is approximately 200 um, which can be reduced in a later manufacturing process.

Figure 32:
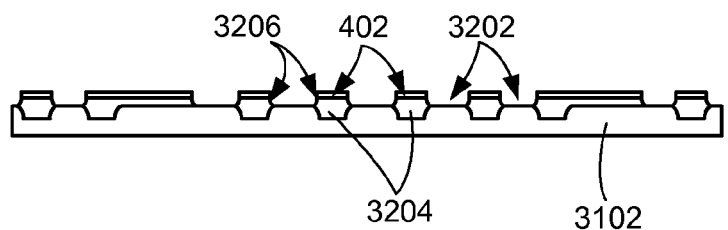
FIG. 32 is the structure of FIG. 31 in an etching phase of manufacture.

Referring now to FIG. 32, therein is shown the structure of FIG. 31 in an etching phase of manufacture. The metal sheet 302 of FIG. 31 is etched off from the exposed metal top surface 3110 of FIG. 31 to form a top recess 3202. The PPF traces 402 cover top surfaces of lead islands 3204 and act as an etching resist. The over-molded material 3102 is exposed from the top recess 3202, which has convex recess side walls 3206.

Figure 33:
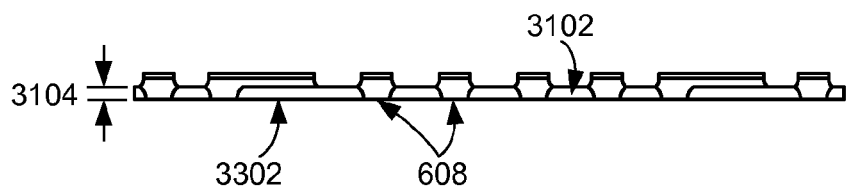
FIG. 33 is the structure of FIG. 32 in a grinding phase of manufacture.

Referring now to FIG. 33, therein is shown the structure of FIG. 32 in a grinding phase of manufacture. The over-molded material 3102 is ground to a desired thickness, approximately 120 um, exposing the exposed pads 608 from the over-molded material 3102. The over-molded material thickness 3106 of FIG. 31 is reduced to be consistent with the recess thickness 3104. A ground over-molded materials bottom surface 3302 is aligned with the exposed pads 608.

Figure 34:
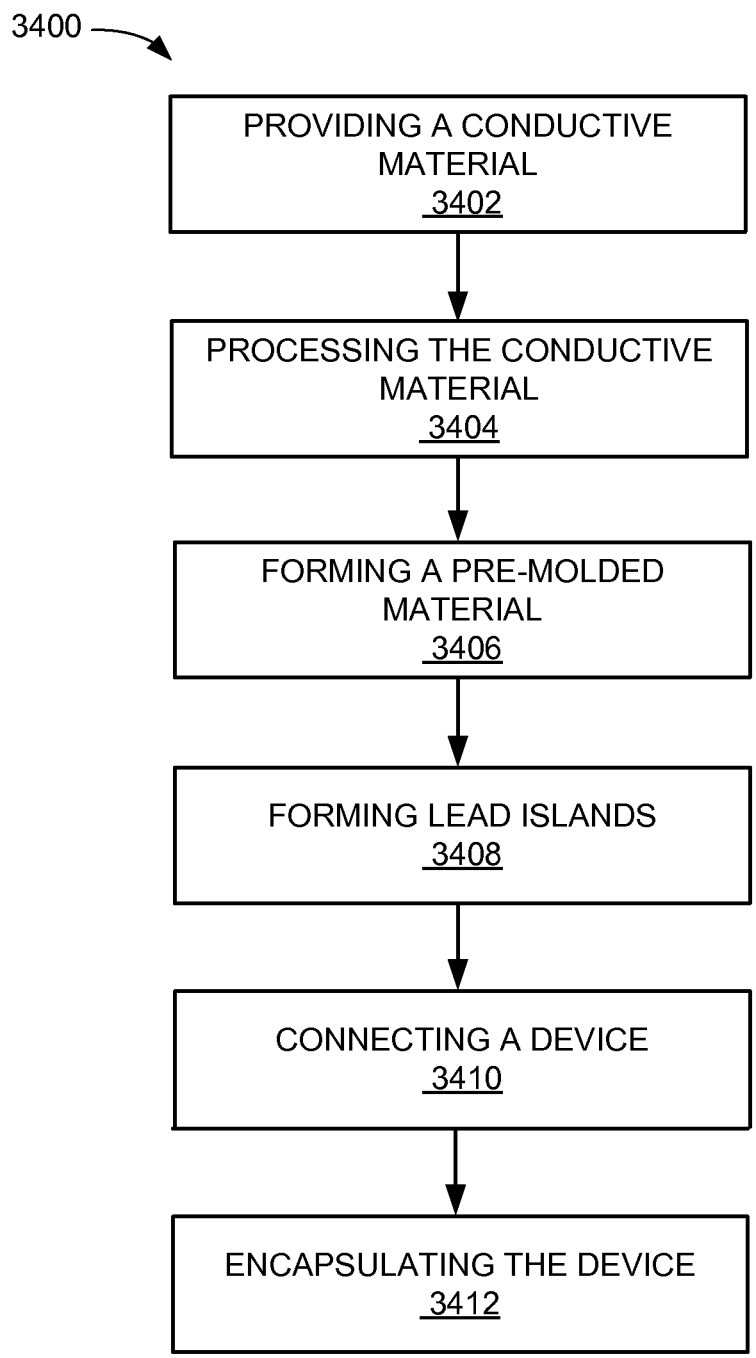
FIG. 34 is a flow chart for the manufacturing of an integrated circuit packaging system of an embodiment of the present invention.

Referring now to FIG. 34, therein is shown a flow chart 3400 for the manufacturing of an integrated circuit packaging system of an embodiment of the present invention. The flow chart 3400 includes providing a conductive material 3402; processing the conductive material to form I/O (input/output) pillars having exposed pads and a bottom recess 3404; forming a pre-molded material in the bottom recess 3406; forming lead islands by further processing the conductive material above the pre-molded material 3408; connecting a device over a portion of the lead islands and having electrical connections to another portion of the lead islands, the electrical connections over areas of the another portion of the lead islands over areas covered by the pre-molded material 3410; and encapsulating the device on the lead islands 3412.

It has been discovered that embodiments of this invention provide a low cost substrate structure by using a pre-plated and pre-etched metal sheet with a pre-molded body. These materials replace more costly conventional materials, such as core and pre-preg materials.

It also has been discovered that the pre-etched metal sheet forms the ball pads by a subtractive (etching) process rather than a build-up process, which has a longer cycle time, higher material cost, and more complicated processes. Use of pre-molded epoxy mold compound (EMC) layer substitutes for pre-preg materials, allows a shorter process time by eliminating masking processes, while provides the required material stiffness desirable for processability.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems, fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    providing a conductive material;
    processing the conductive material to form I/O (input/output) pillars having exposed pads and a bottom recess;
    forming a pre-molded material in the bottom recess;
    forming lead islands by further processing the conductive material above the pre-molded material;
    forming a protection layer over and between the lead islands and the pre-molded material, the protection layer having openings therein over a portion of the lead islands, and the protection layer surrounding a portion of the pre-molded material and a top portion of the lead islands;
    connecting a device over a portion of the lead islands and having electrical connections to another portion of the lead islands, the electrical connections over areas of the another portion of the lead islands over areas covered by the pre-molded material; and
    encapsulating the device on the lead islands.

2. The method as claimed in claim 1 wherein processing the conductive material includes half-etching the conductive material.

3. The method as claimed in claim 1 wherein processing to form the I/O pillars includes processing to form the I/O pillars protruding from and surrounded by the bottom recess.

4. The method as claimed in claim 1 wherein forming the pre-molded material includes having the exposed pads exposed from the pre-molded material.

5. The method as claimed in claim 1 wherein forming the lead islands includes further processing through the conductive material above the pre-molded material to expose a buried pre-molded material surface.

6. A method of manufacture of an integrated circuit packaging system comprising:

providing a conductive material;

etching the conductive material to form I/O (input/output) pillars having exposed pads and a bottom recess;

forming a pre-molded material in the bottom recess;

forming lead islands by further etching the conductive material above the pre-molded material;

forming a lead trace on the lead islands;

forming a protection layer over and between the lead islands, the protection layer having openings therein over a portion of the lead islands, and the protection layer surrounding a portion of the pre-molded material and a top portion of the lead islands;

mounting a device on the protection layer and having electrical connections to another portion of the lead islands, the electrical connections over areas of the another portion of the lead islands over areas covered by the pre-molded material; and encapsulating the device on the protection layer.

7. The method as claimed in claim 6 wherein mounting the device on the protection layer includes connecting the device to the lead trace.

8. The method as claimed in claim 6 further comprising:
forming the lead trace on the conductive material;
etching the conductive material; and
wire bonding the device to the lead trace where the lead trace is partially exposed from the protection layer.

9. The method as claimed in claim 6 further comprising:
forming a plurality of lead traces; and
exposing the plurality of lead traces and the pre-molded material simultaneously.

10. The method as claimed in claim 6 further comprising attaching external contacts at bottoms of the lead islands.

11. An integrated circuit packaging system comprising:
lead islands;
a pre-molded material surrounding a bottom of the lead islands;
a protection layer over and between the lead islands and the pre-molded material, the protection layer having openings therein over a portion of the lead islands, and the protection layer surrounding a portion of the pre-molded material and a top portion of the lead islands;
a device over a portion of the lead islands and having electrical connections to another portion of the lead islands, the electrical connections over areas of the another portion of the lead islands over areas covered by the pre-molded material; and
an encapsulation over the device and the lead islands.

12. The system as claimed in claim 11 wherein the pre-molded material surrounds half of the bottom of the lead islands.

13. The system as claimed in claim 11 wherein the pre-molded material has exposed pads exposed from the pre-molded material.

14. The system as claimed in claim 11 wherein the protection layer is in contact with the pre-molded material.

15. The system as claimed in claim 11 further comprising:
a lead trace on the lead islands; and
the device is over the protection layer and is connected to the lead trace.

16. The system as claimed in claim 15 further including a plurality of lead traces on the lead islands and wherein the device is over a portion of the lead islands and is connected to a portion of the lead traces.

17. The system as claimed in claim 15 further comprising:
a plurality of lead traces on the lead islands;
wherein:
the protection layer is on the plurality of lead traces with portions of the lead traces exposed; and
the device is wire bonded to the portions of the lead traces which are exposed.

18. The system as claimed in claim 15 further comprising a plurality of lead traces on the lead islands and wherein the protection layer partially exposes portions of the plurality of lead traces and portions of the pre-molded material.

19. The system as claimed in claim 15 further comprising external contacts at bottoms of the lead islands.

* * * * *